United States Patent [19]

Dufilie

[11] Patent Number: 5,357,228

[45] Date of Patent: Oct. 18, 1994

[54] SURFACE ACOUSTIC WAVE FILTER HAVING CHANNELS WHICH ARE OFFSET

[75] Inventor: Pierre Dufilie, Le Rouret, France

[73] Assignee: Thomson-CSF, Puteaux, France

[21] Appl. No.: 890,606

[22] PCT Filed: Jan. 15, 1991

[86] PCT No.: PCT/FR91/00024

§ 371 Date: Jul. 13, 1992

§ 102(e) Date: Jul. 13, 1992

[87] PCT Pub. No.: WO91/11856

PCT Pub. Date: Aug. 8, 1991

[30] Foreign Application Priority Data

Feb. 2, 1990 [FR] France ................................. 90 01227

[51] Int. Cl.[5] ............................................. H03H 9/64
[52] U.S. Cl. ..................................... 333/195; 310/313
[58] Field of Search .............................. 333/193, 195; 310/313 R, 313 B, 313 C, 313 D

[56] References Cited

U.S. PATENT DOCUMENTS

| 3,662,293 | 5/1972 | De Vries | 333/151 |
| 4,178,571 | 12/1979 | Mitchell | 333/195 X |
| 4,609,891 | 2/1986 | Solie et al. | 333/195 |
| 5,093,638 | 3/1992 | Kinsman et al. | 333/195 |

FOREIGN PATENT DOCUMENTS

| 30136 | 3/1977 | Japan | 333/193 |
| 20021 | 2/1983 | Japan | 333/195 |
| 43204 | 2/1987 | Japan | 333/193 |

OTHER PUBLICATIONS

Patent Abstracts of Japan, vol. 9, No. 318, Dec. 13, 1985 (E-366) (2041).
Patent Abstracts of Japan, vol. 9, No. 193, Aug. 9, 1985 (E-334) (1916).

Primary Examiner—Benny Lee
Attorney, Agent, or Firm—Roland Plottel

[57] ABSTRACT

Ultrahigh-frequency surface acoustic wave filter has a two-channel structure with, preferably, a symmetric pair of input transducers (2, 6) and an associated pair of weighted output transducers (8, 9), and an associated pair of reflectors (14, 15). These reflectors (14, 15) are offset by a distance (d) equal to a quarter of the acoustic-wave wavelength ($\lambda$), within an integral number of half wavelengths. The weightings of the output transducers are chosen in order to provide the desired impulse response.

8 Claims, 2 Drawing Sheets

SURFACE ACOUSTIC WAVE FILTER HAVING CHANNELS WHICH ARE OFFSET

BACKGROUND OF THE INVENTION

The present invention relates to a surface acoustic wave filter.

An ultrahigh-frequency surface acoustic wave filter comprises, in the simplest embodiment of this kind of filter, an input transducer electrically connected to the input terminal of the filter and an output transducer which is placed on the same piezo-electric substrate as this input transducer so as to be acoustically connected directly (that is to say without any obstacle) to the input transducer and which is electrically connected to the output terminal of the filter.

If it is desired to improve the specifications of such a filter, it proves necessary to increase the length of the substrate (that is to say to increase the distance which corresponds to the direct acoustic path between these two transducers) so as to extend the duration of its impulse response. In fact it is well known that a surface acoustic wave band filter has a response which is better when its impulse response is longer (the ideal filter is that which would have a impulse response of infinite duration). However, this conventional solution has the drawback of excessively increasing the size of this filter and consequently of burdening its manufacturing cost more than is desirable.

There is known, from document "Patent Abstracts of Japan, volume 9, No. 318(E-366) [2041], 13 Dec. 1985 and JP-A, 60-150312 (TOSHIBA), 8 Aug. 1985", a surface acoustic wave filter constituted according to a two-channel structure, each channel comprising respectively an input transducer electrically connected up to the input terminal of the filter and at least one output transducer electrically connected to the output terminal, the input transducer being acoustically connected directly to the output transducer, the output transducers being offset one with respect to the other by $(n+\frac{1}{4})\lambda$, where $\lambda$ is the wavelength of the wave propagating on the filter. There is no reflector (but another output transducer) connected acoustically to the input transducer of each of the channels.

There is also known, from U.S. Pat. No. 3,622,293, a surface acoustic wave device comprising an input transducer, an output transducer and a reflector (20) offset by $\lambda/4$ with respect to the output transducer.

The object of these two devices is only to eliminate the parasitic reflections, especially the triple-transit echo. Neither presents the problem of extending the duration of the impulse response.

SUMMARY OF THE INVENTION

In order to overcome these drawbacks, the invention proposes an improved surface acoustic wave filter.

The invention aims to overcome this drawback. It relates for this purpose to a surface acoustic wave filter characterised:
in that it is constituted according to a two-channel structure, each channel comprising respectively an input transducer electrically connected up to the input terminal of the filter, an output transducer electrically connected to the output terminal of the filter, this input transducer being acoustically connected directly to this output transducer, and a surface-wave reflector acoustically connected directly to one of these two transducers; and in that the two respective distances, each of which corresponds to the direct acoustic path between this reflector and the transducer to which it is acoustically connected directly, differ, to within an integral number of halves of the surface-wave propagation wavelength, by a quarter of the wavelength.

The two aforementioned input transducers are preferably identical and are short-type transducers, that is to say non-weighted.

The distances which separate each of the input transducers from the output transducer, with which it is acoustically associated, are advantageously equal.

The output transducers are preferably long-type weighted transducers, the respective weightings of which are chosen in order to confer on the filter the desired impulse-response curve.

The two input transducers are, still preferably, symmetric in relation to the longitudinal axis of the filter.

As regards the two output transducers, these advantageously involve equal-size transducers and they are preferably disposed symmetrically with respect to the longitudinal axis of the filter.

According to one possible embodiment, this surface acoustic wave filter furthermore comprises a second pair of reflectors which is associated with that pair of transducers, which is not associated with the first pair of reflectors, these two other reflectors themselves being also longitudinally offset one with respect to the other by a distance which is equal to a quarter of the surface acoustic wave propagation wavelength.

Anyway, the invention will be better understood, and its advantages and other characteristics will emerge, during the following description of several non-limiting exemplary embodiments, by reference to the attached schematic drawing in which:

BRIEF DESCRIPTION OF THE DRAWINGS

In the different figures, the same elements are denoted by the same reference labels.

DESCRIPTION OF THE PREFERRED EMBODIMENT

Figure 1:
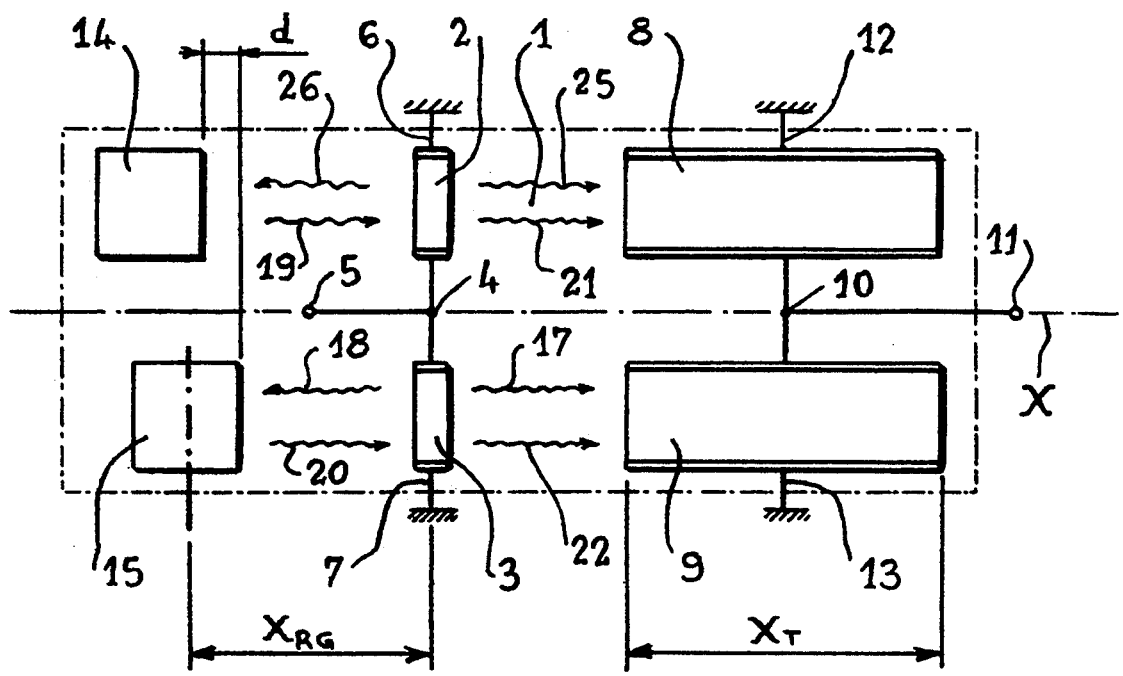
FIG. 1 is a first embodiment of this ultrahigh-frequency surface acoustic wave filter.

FIG. 1, shows schematically an ultrahigh-frequency surface acoustic wave filter which has, on a single piezoelectric substrate 1 (surrounded by dot/dash lines in this figure):

Two "input" transducers 2,3 which are identical and "short"-type, that is to say each comprising a very small number of equal-length interdigitated fingers (two or three fingers for example). These two transducers are identical and they are placed, on the substrate 1, symmetrically with respect to the longitudinal axis X of the substrate 1. They are, in this particular case, electrically connected in parallel with a common terminal 4 electrically connected to the terminal 5 for input of the ultrahigh-frequency signal and their other terminal, respectively 6 and 7, connected to earth.

Two "output" transducers 8, 9 which are equal-size "long"-type weighted transducers. These two transducers, the respective weightings of which are determined, as will be seen hereinbelow, by the desired transfer function, are themselves also placed symmetrically with respect to the axis X and are therefore not offset in the longitudinal direction one with respect to the other. They are, in this particular case, electrically connected in parallel with a common terminal 10, electrically connected to the output terminal 11 of the filter, and their other terminal, respectively 12 and 13, connected to earth. Two surface acoustic wave reflectors 14 and 15 which are placed on either side of the longitudinal axis X, at equal distances from the axis, but which are offset one with respect to the other and in the longitudinal direction by a distance d equal to a quarter of the surface acoustic wave propagation wavelength λ. The reflector 14 is associated with the transducer 2 and it is thereby longitudinally aligned with the transducer and placed, with respect to this input transducer 2, on the opposite side from the output transducer 8. In the same way, the reflector 15 is associated with the transducer 3 and it is thereby longitudinally aligned with it and placed, with respect to this second input transducer 3, on the opposite side from the second output transducer 9: finally, the elements 14, 2, 48, are aligned in the longitudinal direction (that is to say along the surface acoustic wave propagation direction) and this also applies to the three other elements 15, 3, 9, whereas these two respective "trios" 14, 2, 8 and 15, 3, 9 are placed on either side of the longitudinal axis X.

The operation of the filter of FIG. 1 is as follows:

In response to the ultrahigh-frequency electrical signal which is applied at 5 to the input transducers 2 and 3, the transducer 2 generates a surface acoustic wave 25 towards the right, in the direction of the transducer 8, and another surface acoustic wave 26 towards the left, in the direction of the reflector 14, whereas, in the same way, the transducer 3 generates a surface acoustic wave 17 towards the right, in the direction of the transducer 9, and another surface acoustic wave 18 towards the left, in the direction of the reflector 15.

The direct waves 25 and 17 are equal in amplitude and in sign and they are therefore called "symmetric" waves. They arrive in phase at the weighted transducers 8 and 9. The weighting of the transducer 8 is such that its time response is defined by a transfer function $h_1$. Likewise, the transducer 9 is weighted such that its time response corresponds to another transfer function $h_2$. Since symmetric-type waves 25, 17 are involved, it finally follows that there is a resultant transfer function $h_S$:

$$h_S = h_1 + h_2$$

for these two direct waves 25 and 17, which corresponds to a first impulse-response portion, the duration of which corresponds to the common length $X_T$ of the two transducers 8 and 9.

The waves 26 and 18 are respectively reflected at the reflectors 14 and 15 in order to give respective return waves 19 and 20 which, because of the aforementioned offset d, are phase-shifted one with respect to the other by a half wavelength and which, consequently, arrive at the symmetric transducers 2 and 3 in phase opposition: the pair of reflected waves 19, 20 is therefore of "antisymmetric" type and, as the transducers 2, 3 are symmetric, these two transducers are then transparent for this pair of reflected waves and their electrical access may be modified. The pair of acoustic waves 19, 20 therefore traverses, without appreciable absorption, the pair of transducers 2, 3 and continues its path, along 21 and 22, towards the pair of output transducers 8, 9.

If the average longitudinal distance between the pair of transducers 2, 3 and the pair of reflectors 14, 15, is designated by $X_{RG}$, the aforementioned distance d being in fact negligible with respect to the latter, it would therefore appear that the two antisymmetric reflected waves 21, 22 arrive at the output transducers 8, 9 with a delay, with respect to the symmetric direct waves 25, 17, corresponding to twice the time necessary for the surface acoustic waves to travel this distance $X_{RG}$. The transfer function which results from these two waves 21, 22 is a function:

$$h_A = h_1 - h_2$$

and, considered alone, it also has a duration, in terms of impulse response, which corresponds to the aforementioned length $X_T$.

Finally, the impulse response of the filter is composed:

of a first response curve, of duration corresponding to 2 $X_{RG}$, which is that of the single aforementioned function $h_S$; then, in the time interval between 2 $X_{RG}$ and $X_T$, of a second curve corresponding to the sum of the aforementioned functions $h_S$ and $h_A$, because the direct 25, 17 and reflected 21, 22 waves then act together on the transducers 8 and 9; finally, in the last time interval which is between $X_T$ and $X_T + 2$ $X_{RG}$, when only the reflected waves 21, 22 remain present, of a third impulse-response curve corresponding to the single aforementioned function $h_A$.

The total impulse response of the filter, which is therefore extended by 2 $X_{RG}$ with respect to the response $X_T$ of a conventional filter without reflectors, is calculated from these three successive partial responses.

It goes without saying that the respective weightings of the output transducers 8, 9, which are necessary for obtaining the desired impulse response, are determined by the reverse argument: knowing this impulse-response curve, the two response curves $h_A$ and $h_S$ are first of all drawn, the composition of which, in terms of times and amplitudes, gives this impulse response. From this the transfer functions $h_1$ and $h_2$ of the transducers 8 and 9 and therefore the respective weightings to be applied to these two transducers are then calculated, by simple application of the formulae:

$$h_1 = \frac{h_S + h_A}{2} \text{ and } h_2 = \frac{h_S - h_A}{2}$$

It should be well noted at this stage that a filter such as that of FIG. 1 operates correctly only because it comprises a pair of reflectors, a pair of input transducers and a pair of output transducers and that it is therefore constituted according to a two-channel structure. A filter which was composed of only a single input transducer 2, for example, a single reflector, 14 in this example, and a single output transducer, 8 in this example, and which was therefore produced as a single-channel structure, could not be used satisfactorily for the following two main reasons:

the efficiency of the short transducer, 2 in this example, would have to be very low in order for the reflected acoustic waves to be able to traverse it without virtually their entire energy being absorbed in the electrical impedance connected to this transducer; the "direct" and "reflected" responses would not be independent since the second is a replica of the first: the resultant impulse response cannot, as is the case for the filter of FIG. 1, be controlled at every point.

Returning to FIG. 1, it was assumed in the above that the terminal 5 was the input terminal of the filter and the terminal 11 its output terminal. The Applicant has been able to observe that, for reversibility which is very well understood for a filter of this type, this filter also operates in the reverse direction, that is to say by applying the input electrical signal to the terminal 11 and by taking up its electrical output signal from the terminal 5.

Moreover, which may also be very easily understood, it is possible to join up the input transducers 2, 3, together with the output transducers 8, 9, in series and not in parallel. Such an embodiment is moreover represented, by way of indication, in FIG. 2 which will be described hereinbelow. Likewise, the transducers 2, 3 may be joined up in parallel and the transducers 8, 9 in series, or vice versa.

Figure 2:
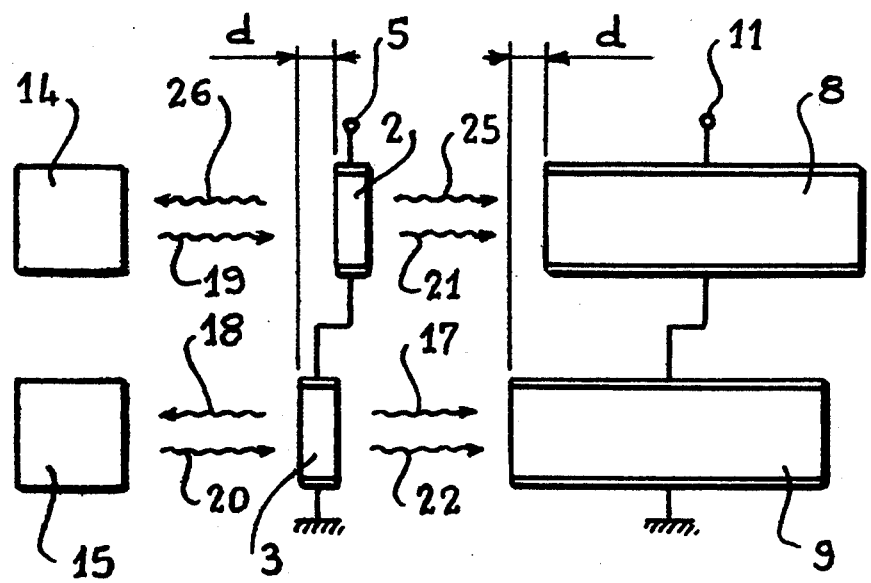
FIG. 2 is an alternative form of the filter of FIG. 1.

FIG. 2 represents, by way of illustration of the nonlimiting character of the present invention, an alternative forth of the filter of FIG. 1 where not only are the respective pairs of transducers 2, 3 and 8, 9 connected in series and not in parallel, but it is furthermore the two short transducers 2, 3 which are offset one with respect to the other by $d=\lambda/4$, and not the reflectors 14, 15 which are then aligned in the transverse direction. Preferably in such a case, in order to keep the longitudinal distances between the transducers 2 and 8 on the one hand, and 3 and 9 on the other hand, equal, the long transducers 8 and 9 are then offset, one with respect to the other, by a distance d in the same direction as the transducers 2 and 3. The operation of this filter is, of course, identical to that of FIG. 1, $h_S$ generally remaining the response to a pair of waves 25, 17 emitted by the input transducers 2, 3, whereas $h_A$ is the response obtained when the wave of the lower acoustic channel of the emitted pair is changed in sign by a phase shift of a half wavelength.

As goes without saying, the aforementioned minimum offset distance is equal to $\lambda/4$ (i.e. when n=0) $\lambda$ is:

$$d=(n+\tfrac{1}{2})\lambda/2$$

where n is an integer.

Numerous other alternative forms of this filter may also be imagined. Two of these are represented in FIGS. 3 and 4, purely by way of indication.

Figure 3:
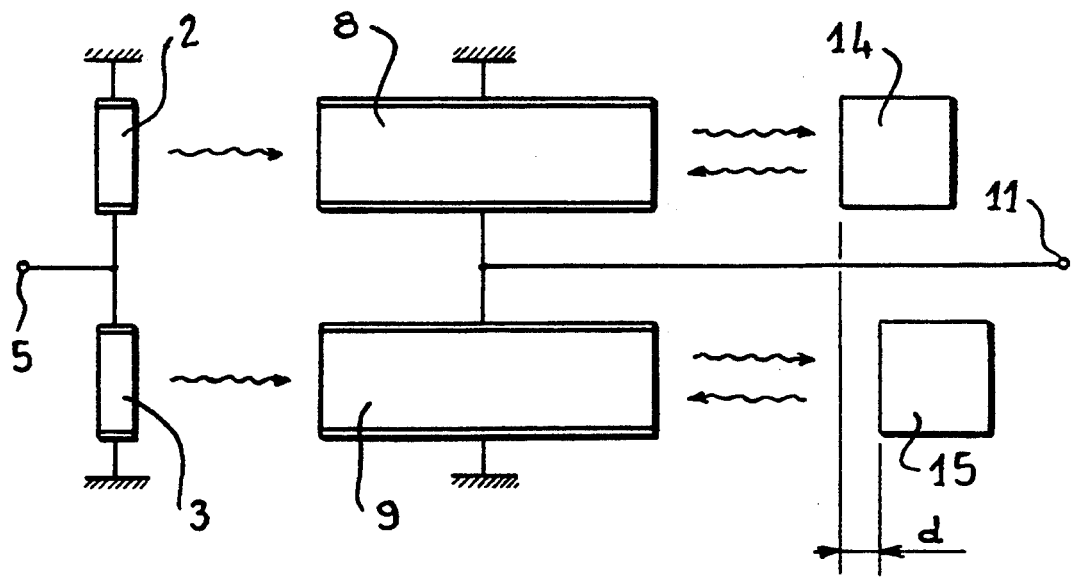
FIG. 3 is a third embodiment of this filter.

FIG. 3 shows a filter which is differentiated from that of FIG. 1 by the fact that the reflectors 14 and 15, which are still longitudinally offset, are associated with long "output" transducers 8, 9 instead of being associated with short "input" transducers 2, 3. It has been observed that such a filter also operated satisfactorily, therefore acquiring thereby an extension of the impulse response while enabling the latter to be modelled easily.

Figure 4:
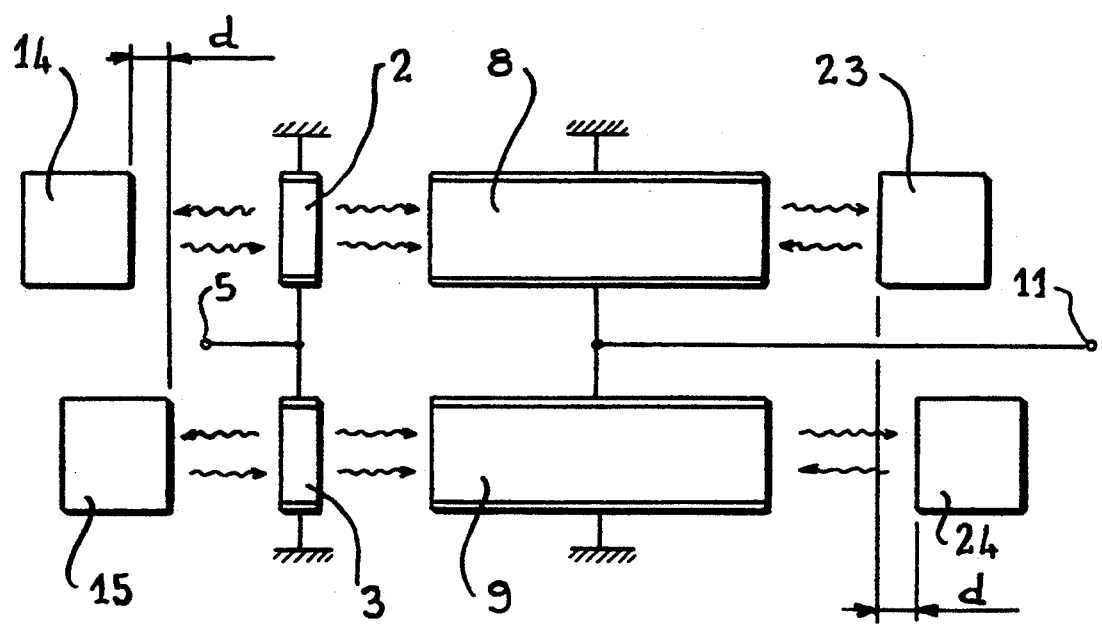
FIG. 4 is a fourth embodiment of such a surface-acoustic wave filter.

Finally, FIG. 4 shows a filter which is a combination of the filters according to FIGS. 1 and 3. This filter has two pairs of reflectors instead of a single one:

a first pair of reflectors 14, 15 which are associated with the short transducers 2, 3 and which, as in the manner of those of FIG. 1, are longitudinally offset one with respect to the other by the aforementioned distance d; and a second pair of reflectors 23, 24 which are associated with the long transducers 8, 9 and which, as in the manner of FIG. 4, are themselves also longitudinally offset one with respect to the other by a quarter of the surface acoustic wave propagation wavelength.

As goes without saying, the invention is not limited to the exemplary embodiments which have just been described, but, quite to the contrary, it is capable of being produced in many other equivalent forms, even in a lower level mode (that is to say not corresponding to the preferred forms described hereinabove).

I claim:

1. Surface-acoustic wave filter having a two-channel structure (14, 2, 8 and 15, 3, 9) on a substrate, each channel, extending longitudinally on the substrate, comprising a respective input transducer (2, 3) electrically connected to an input terminal (5) of the filter, and a respective output transducer (8, 9) electrically connected to an output terminal (11) of the filter, each said input transducer (2, 3) being acoustically connected directly to the corresponding output transducer (8, 9), and a respective surface-acoustic wave reflector (14, 15) is acoustically connected directly to the corresponding one (2, 3) of said input transducers; and wherein respective direct acoustic path distances (16, 18) between the respective reflectors (14, 15) and the corresponding transducers (2, 3) to which they are directly acoustically connected differ by a multiple of a quarter of the wavelength ($\lambda$) of the surface-wave propagating wavelength ($\lambda$) wherein said multiple is an odd integer; and wherein the respective input transducers are short type transducers and the respective output transducers (8, 9) are long-type weighted transducers having respective weightings to confer on the filter a desired impulse-response curve.

2. Surface-acoustic wave filter having a two-channel structure (14, 2, 8 and 15, 3, 9) on a substrate, each channel, extending longitudinally on the substrate, comprising a respective input transducer (2, 3) electrically connected to an input terminal (5) of the filter, and a respective output transducer (8, 9) electrically connected to an output terminal (11) of the filter, each said input transducer (2, 3) being acoustically connected directly to the corresponding output transducer (8, 9), and a respective surface-acoustic wave reflector (14, 15) is acoustically connected directly to the corresponding one (2, 3) of said input transducers; and wherein respective direct acoustic path distances (16, 18) between the respective reflectors (14, 15) and the corresponding transducers (2, 3) to which they are directly acoustically connected differ by a multiple of a quarter of the wavelength ($\lambda$) of the surface-wave propagating wavelength ($\lambda$) wherein said multiple is an odd integer; wherein the two output transducers (8, 9) are disposed symmetrically with respect to a longitudinal axis (X) of the filter between the two channels.

3. Surface-acoustic wave filter having a two-channel structure (14, 2, 8 and 15, 3, 9) on a substrate, each channel, extending longitudinally on the substrate, comprising a respective input transducer (2, 3) electrically connected to an input terminal (5) of the filter, and a respective output transducer (8, 9) electrically connected to an output terminal (11) of the filter, each said input transducer (2, 3) being acoustically connected directly to the corresponding output transducer (8, 9), and a respective surface-acoustic wave reflector (14, 15) is acoustically connected directly to the corresponding one (2, 3) of said input transducers; and wherein respective direct acoustic path distances (16, 18) between the respective reflectors (14, 15) and the corresponding transducers (2, 3) to which they are directly acoustically connected differ by a multiple of a quarter of the wavelength (λ) wherein said multiple is an odd integer; and of the surface acoustic wave propagating wavelength (λ) further comprising a second pair of reflectors (23, 24) with respective ones of said second pair of reflectors disposed in corresponding channels, said second reflectors (23, 24) themselves being also longitudinally offset one with respect to the other by a distance (d) which is equal to quarter of the surface acoustic wave propagation wavelength (λ).

4. Surface-wave filter according to claim 2 or 3, characterised in that the input transducers are short-type transducers (2, 3).

5. Surface acoustic wave filter according to claim 1 or 2 or 3 characterised in that distances which separate each of the input transducers (2, 3) from the output transducer (8, 9), with which it is acoustically associated, are equal.

6. Surface-wave filter according to claim 1 or 2 or 3, characterised in that the two input transducers (2, 3) are symmetric with respect to longitudinal axis (X) of the filter between the two channels.

7. Surface-waver filter according to claim 1, or 2 or 3 characterised n that the two output transducers (8, 9) are of a same-size.

8. Surface acoustic wave filter according to claim 1, or 2, or 3, characterized in that the two input transducers (2, 3) are of the same type.

* * * * *